United States Patent [19]

Amatangelo

[11] Patent Number: 4,845,388
[45] Date of Patent: Jul. 4, 1989

[54] TTL-CMOS INPUT BUFFER

[75] Inventor: Matthew J. Amatangelo, Orlando, Fla.

[73] Assignee: Martin Marietta Corporation, Bethesda, Md.

[21] Appl. No.: 145,950

[22] Filed: Jan. 20, 1988

[51] Int. Cl.$^4$ ............... H03K 19/092; H03K 19/094; H03K 19/20; H03K 17/04

[52] U.S. Cl. .................... 307/475; 307/451; 307/579; 307/585

[58] Field of Search ............ 307/475, 451, 473, 585, 307/576, 579, 443, 264, 263; 323/315; 330/288

[56] References Cited

U.S. PATENT DOCUMENTS

| | | | |
|---|---|---|---|
| 3,676,700 | 7/1972 | Buchanan | 307/475 |
| 3,708,689 | 1/1973 | Lattin | 307/475 |
| 4,048,518 | 9/1977 | Koo | 307/475 |
| 4,295,065 | 10/1981 | Hsieh et al. | 307/475 |
| 4,380,710 | 4/1983 | Cohen et al. | 307/475 |
| 4,406,956 | 9/1983 | Clemen et al. | 307/475 |
| 4,406,957 | 9/1983 | Atherton | 307/475 |
| 4,437,025 | 3/1984 | Liu et al. | 307/475 |
| 4,469,959 | 9/1984 | Luke et al. | 307/264 |
| 4,471,242 | 9/1984 | Noufer et al. | 307/475 |
| 4,475,050 | 10/1984 | Noufer | 307/475 |
| 4,477,736 | 10/1984 | Onishi | 307/475 X |
| 4,486,671 | 12/1984 | Ong | 307/475 X |
| 4,518,879 | 5/1985 | Greene | 307/475 X |
| 4,677,321 | 6/1987 | Bacrania | 307/585 X |
| 4,682,047 | 7/1987 | Von Sichart | 307/585 X |
| 4,686,383 | 8/1987 | Croft | 307/571 X |
| 4,717,845 | 1/1988 | Dunn | 323/315 X |
| 4,763,022 | 8/1988 | Sheldon | 307/264 X |

FOREIGN PATENT DOCUMENTS 2373921  8/1978  France ................. 307/475

Primary Examiner—John S. Heyman
Assistant Examiner—David R. Bertelson
Attorney, Agent, or Firm—MacDonald J. Wiggins; Gay Chen

[57] ABSTRACT

An interface circuit conditions TTL logic level signals to be compatible CMOS logic circuits. An inverter (14) is disposed on a CMOS logic circuit chip (10) for receiving TTL logic level signals. The switching voltage point of the inverter is controllable by a bias voltage. A bias generator (12) on the chip produces a bias voltage for the inverter which is compensated for supply voltage, temperature and process variations and which is utilized to stabilize the inverter switching point.

10 Claims, 3 Drawing Sheets

TTL-CMOS INPUT BUFFER

TECHNICAL FIELD

The present invention relates to logic circuit interfaces, and more particularly to an integrated circuit interface device compensated for process, voltage and temperature.

BACKGROUND ART

Bipolar integrated logic circuits operate at relatively low voltage logic levels. For example, a LOW or ZERO logic level for transistor-transistor logic (TTL) circuits may be in the 0-0.8 volt range while a HIGH or ONE level may be in the 2.0 volt-to-power supply voltage. Thus, the transition point of a TTL logic circuit is preferably about 1.4 volts.

For large scale integrated field effect transistor circuitry, low threshold complementary metal-oxide semiconductors (CMOS) are used which may operate with supply voltages in the 5 volt range. It is often required to interface TTL circuits with CMOS integrated circuits, thereby necessitating a buffer or level changer to translate from the TTL levels to the CMOS levels.

In designing a simple inverter for use as an input buffer for operating CMOS logic from TTL logic levels, the N-channel current and the P-channel current at the switching point can be expressed as $$I_N = K'_N \frac{W_N - \Delta W_N}{L_N - \Delta L_N} [V_{gs} - V_{TN}]^2 ; \quad (1)$$

$$I_P = K'_P \frac{W_P - \Delta W_P}{L_P - \Delta L_P} [V_{cc} - V_{gs} + V_{TP}]^2 ; \quad (2)$$

where
- $K'_N$ and $k'_P$ are device gain constants,
- $W_N$ is the width of an N-channel device,
- $W_P$ is the width of a P-channel device,
- $L_N$ is the length of an N-channel device,
- $L_P$ is the length of a P-channel device,
- $\Delta$ represents the change in widths or lengths due to the process,
- $V_{gs}$ is the voltage across the gate and source,
- $V_{cc}$ is the power supply voltage, and
- $V_{TN}$ and $V_{TP}$ are the threshold voltages for the devices.

The switching point for the inverter can be expressed as $$V_{INV} = \frac{V_{CC} + V_{TP} + V_{TN} \sqrt{\frac{K'_N (W_N - \Delta W_N)(L_P - \Delta L_P)}{K'_P (W_P - \Delta W_P)(L_N - \Delta L_N)}}}{1 + \sqrt{\frac{K'_N (W_N - \Delta W_N)(L_P - \Delta L_P)}{K'_P (W_P - \Delta W_P)(L_N - \Delta L_N)}}} \quad (3)$$

where $V_{INV}$ is the input voltage that yields $V_{IN} = V_{out}$.

An important parameter in digital switching circuits is the delay time required for switching and, therefore, the point at which a logic gate switches must be stable.

Referring now to equations (1) and (2) for $I_N$ and $I_P$, the parameters which can vary in the production of integrated logic circuits are $K'_N$, $K'_P$, $\Delta W_N$, $W_P$, $\Delta L_N, \Delta L_P$, $V_{TN}$ and $V_{TP}$.

Such process variations from chip to chip will result in differing transconductances among the devices. For example, it is possible for $K'_P$ to have a higher value than normal, and $K'_N$ to have a lower value than normal resulting in a high $I_P$ and a low $I_N$, thereby causing the switch point voltage to be higher than nominal, and the voltage margin between $V_{INV}$ and the minimum logic ONE input of 2 volts to be decreased. Further, if $V_{INV}$ is greater than 2 volts, the device would fail to operate. Additionally, a reduction of the voltage margin will increase the delay time of switching since the transconductance of an N device decreases as $V_{INV}$ increases. $V_{INV}$ is directly proportional to $V_{cc}$ and therefore increasing $V_{cc}$ will reduce the N device transconductance relative to the P device.

Therefore, to ensure a reliable design of an interface between TTL and CMOS logic circuits, compensation is required for supply voltage, process and temperature variations.

A number of interface devices between TTL and CMOS logic circuits is known in the prior art. U.S. Pat. No. 4,380,710 to Cohen et al disclose an interface circuit requiring a quite large chip area and having high parasitic capacitance on the output node. A level shift circuit is described by Hsieh et al in U.S. Pat. No. 4,295,065. This circuit lacks voltage and process compensation. A buffer for NMOS technology is taught by Lin et al in U.S. Pat. Nos. 4,437,025, 4,475,050 to Noufer and 4,471,242 to Noufer et al disclose TTL to CMOS input buffers. Neither provide process compensation and both require relatively high static current.

Other related patents include: U.S. Pat. Nos. 3,676,700, Buchanan; Lattin, 3,708,689; Koo, 4,048,518; and Luke et al, 4,469,959.

There remains a need for a TTL/CMOS interface circuit having voltage, temperature and process compensation as well as low static current drain, fast transition time, and low output parasitic capacitance without requiring excessive chip area.

DISCLOSURE OF INVENTION

The present invention is an integrated circuit device that conditions TTL logic level signals to be recognized by CMOS logic circuitry for providing direct TTL-to-CMOS compatibility.

The device is implemented in CMOS and is incorporated on the CMOS logic chip. The device includes two elements: an analog compensated bias voltage generator and a digital TTL input inverter/buffer.

The bias generator utilizes a pair of transistors connected to the source of dc power which produce a precompensation bias voltage. This bias voltage is applied to one of three transistors in an active voltage divider configuration. These transistors produce an output voltage which varies in accordance with the process, the voltage, and the temperature. An output bias line from the divider makes the bias voltage, compensated for process, voltage and temperature, available to the chip. Only one bias generator is required per chip and the bias line is routed to each inverter/buffer on the chip.

The inverter element utilizes four CMOS transistors. The gate of one of the transistors is connected to the compensated bias line. This transistor has its drain connected to the inverter output and, in combination with a second transistor, serves to handle the major portion of the pull-down current to ground. A third inverter transistor has its gate connected to a bond pad for receiving the TTL logic signals, and its source to the inverter output. The third transistor is the pull-up portion of the inverter. The fourth transistor has no compensation and provides a parallel path to ground, thereby providing stability against bias line noise.

The invention results in lower static current, faster output transition time, improved sensitivity to induced noise, and superior compensation for process, temperature and voltage than known prior art TTL-to-CMOS circuits.

It is therefore a principal object of the invention to provide an interface circuit for receiving an input from a TTL logic circuit and converting such input to drive a CMOS logic circuit, using CMOS devices and which includes process, voltage and temperature compensation. The interface circuit is mounted on a chip containing the CMOS circuits to be driven.

It is another object of the invention to provide a TTL-to-CMOS logic interface circuit having a compensated bias generator and a compensated bias line connected to one or more inverter/buffer circuits on the chip.

It is still another object of the invention to provide a TTL-to-CMOS logic interface circuit having low static current, rapid transition time, and low sensitivity to induced noise.

These and other objects and advantages of the invention will become apparent from the following detailed description when read in conjunction with the drawings.

BEST MODE FOR CARRYING OUT THE INVENTION

Figure 1:
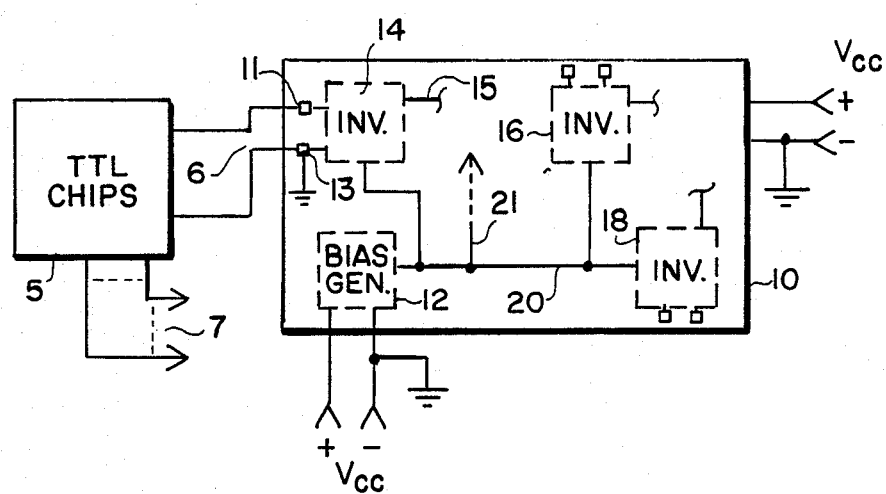
FIG. 1 is a block diagram showing a chip incorporating the invention connected to a TTL output.

Referring to FIG. 1, a block diagram of the invention is shown. The invention provides an interface on a chip 10 for CMOS logic circuits (not shown) from TTL chips 5 to provide direct compatibility therebetween. One TTL chip output 6 is shown having its logic output connected to bond pads 11, 13 on chip 10. These pads provide an input to an inverter/buffer 14 having its output 15 connected to a CMOS circuit to be driven (not shown). Chip outputs 7 may provide other TTL logic outputs.

A bias generator 12 on chip 10 receives power source voltage $V_{cc}$ and outputs a bias voltage on bias line 20 which produces a bias voltage dependent upon the process, the temperature, and the value of supply voltage $V_{cc}$ and therefore provides a compensated bias voltage. Bias line 20 is connected to inverter/buffer 14 and may also supply bias to additional inverter/buffers on chip 10 such as inverter/buffers 16 and 18 and others via line 21.

Figure 2:
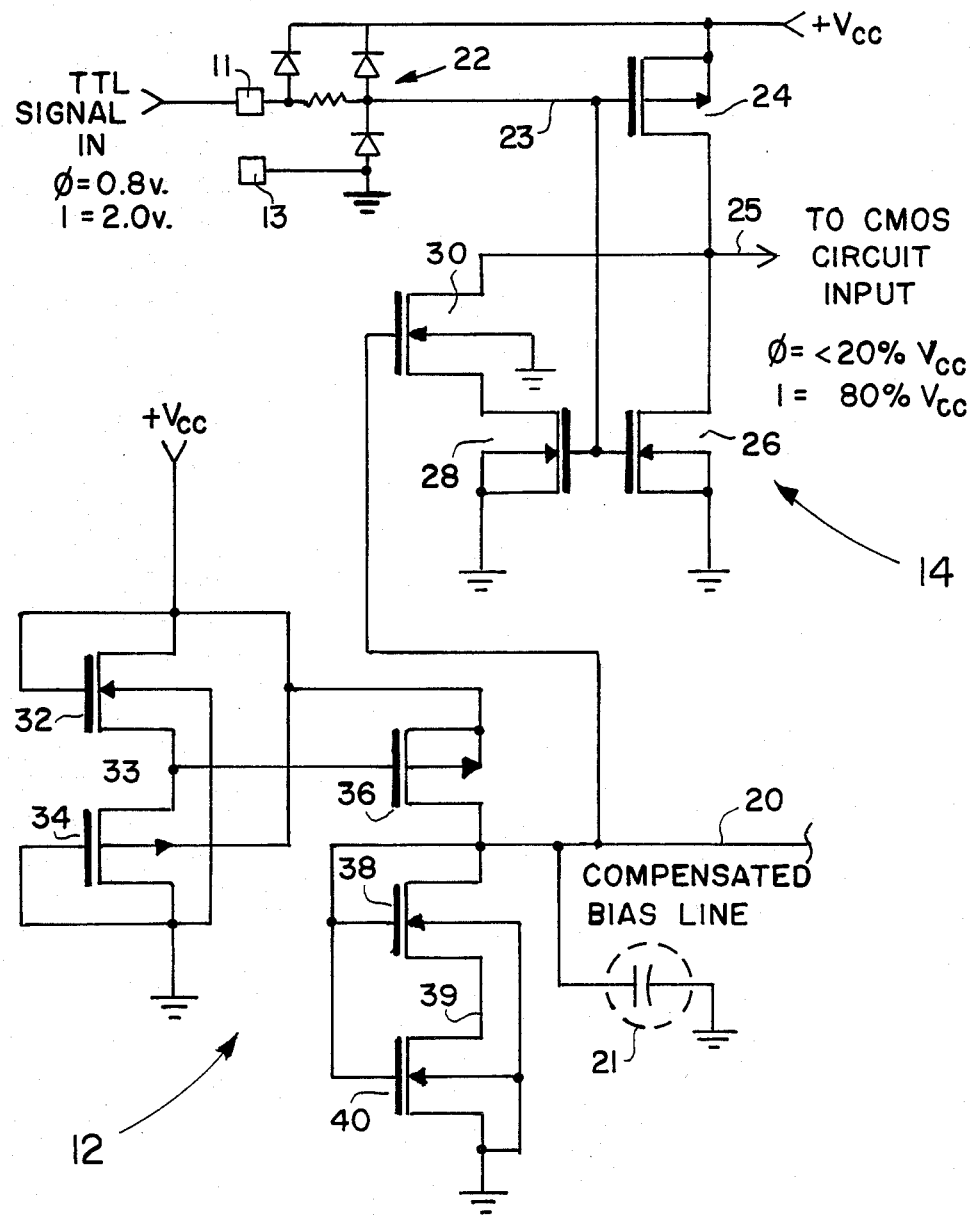
FIG. 2 is a schematic diagram of an inverter/buffer and compensated bias generator of FIG. 1.

In FIG. 2, a schematic diagram of an exemplary embodiment of the invention is shown. Inverter/buffer 14 is illustrated in which a TTL signal having an 0.8 volt level for a logic ZERO and a 2.0 volt level for a logic ONE is applied across bond pads 11 and 13, with pad 13 connected to a common ground. The signal is fed via a typical input protection circuit 22 and lead 23 to the input of inverter 14.

Figure 3:
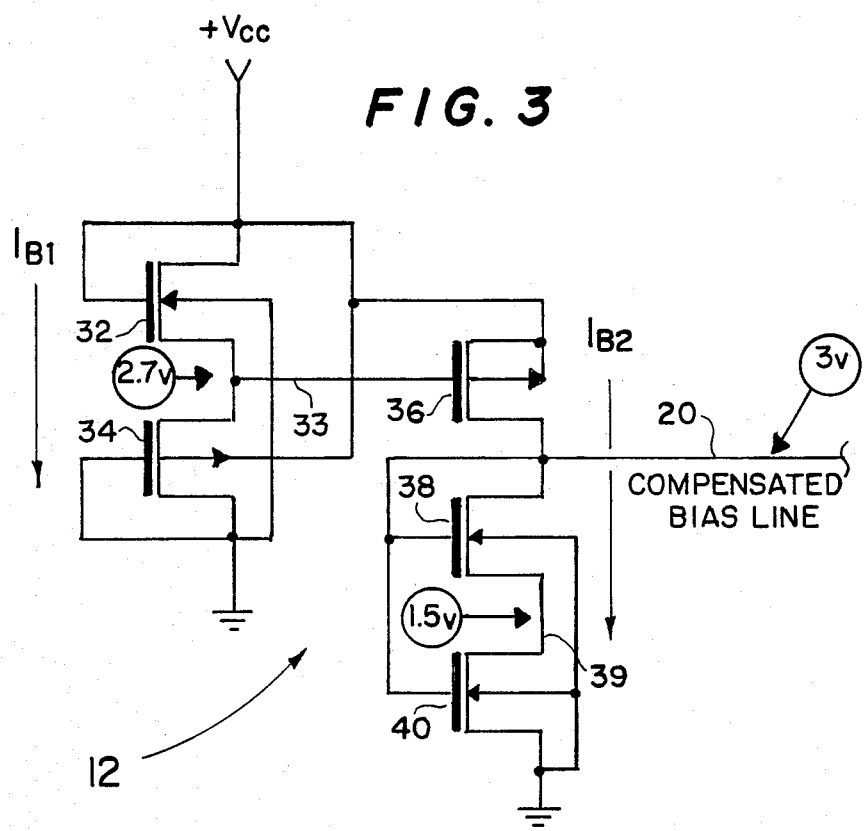
FIG. 3 is a schematic diagram of the bias generator of FIG. 2 showing current paths and circuit voltages.

Before describing the operation of inverter 14, it is pertinent to explain bias circuit 12. Referring to FIG. 3, typical operating potentials are shown.

Current $I_{B1}$ will have a magnitude dependent upon the value of supply voltage $V_{cc}$ and will flow through transistors 32 and 34 that act as a voltage divider for the supply voltage which may vary typically between 4.5 and 5.5 volts. For a 5 volt supply, the voltage at point 33 may be 2.7 volts as shown in FIG. 3. This potential, which will vary with process, voltage, and temperature conditions, is applied to the gate of transistor 36. Current $I_{B2}$ flows through transistors 36, 38, and 40 and form an active voltage divider producing an additional level of process compensation. Typically, the output voltage on bias line 20 is 3 volts. It is important that transistors 32, 34, 36, 38 and 40 be laid out in close physical proximity and well isolated from other circuitry on the chip to avoid noise problems.

Figure 4:
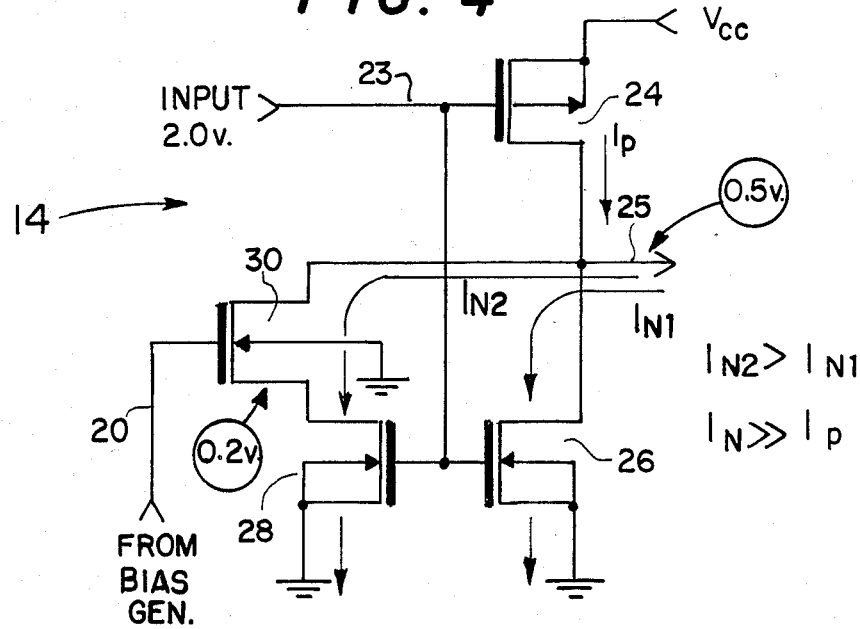
FIG. 4 and FIG. 5 are schematic diagrams of the inverter/buffer of FIG. 2 showing current paths and circuit voltages for a logic ONE input and a logic ZERO input respectively.
Figure 5:
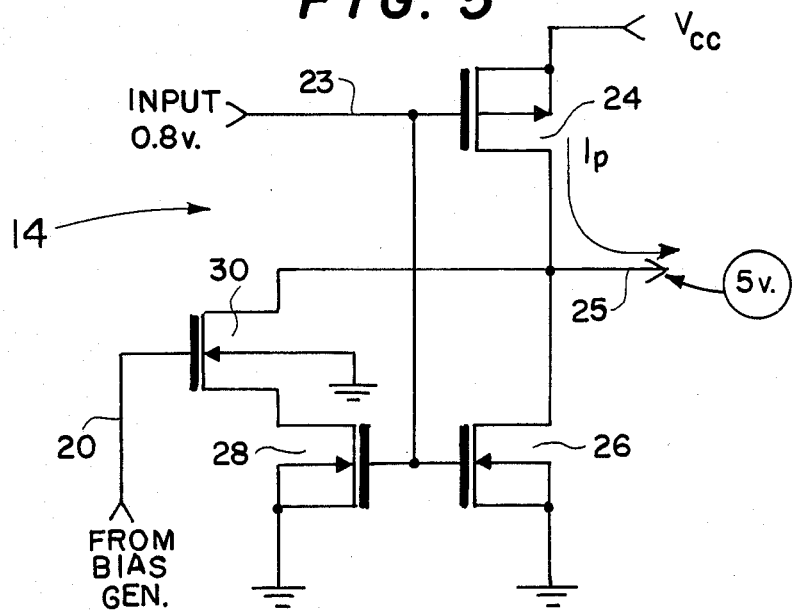

Turning now to FIGS. 4 and 5, the operation of inverter 14 will be discussed for each logic level input. In FIG. 4, 2.0 volts is present on input lead 23 to the gate of P-channel transistor 24. Transistor 26 is in parallel with the series connected transistors 30 and 28 thereby providing a parallel path to ground from the output lead 25. The output lead 25 to the CMOS circuit to be driven is thus taken from the connection between P-channel transistor 24 and N-channel transistors 26 and 30.

When the 2.0 volt level signal is applied to input pad 11 of FIG. 2, transistor 24 will be sourcing current $I_P$ and the circuit being driven will sink $I_{N1}$ and $I_{N2}$ as indicated in FIG. 4 which illustrates the currents and potentials for such condition. This produces an output voltage of typically 0.5 volts on lead 25. That is, $I_p$ is much smaller than $I_{N1}+I_{N2}$.

Output lead 25 is also connected to the drain of N-channel transistor 30 which is in series with N-channel transistor 28 to ground. The gates of transistors 26 and 28 are connected together and to the input lead 23 to transistor 24. The gate of transistor 30 receives the compensated bias voltage, typically 3 volts, from bias line 20.

Referring to FIG. 4, for a 2.0 volt input to inverter/buffer 14 which appears on the gate of transistors 28 and 26, transistor 26 passes current $I_{N1}$ from the driven CMOS circuit via output lead 25 to ground, while current $I_{N2}$ flows from output line 25 via transistors 30 and 28 to ground. As will be understood, the impedance of the current path through transistors 30 and 28 is controlled by the bias voltage on line 20 and the logic level signal. As discussed above, the bias voltage on line 20 will vary and depends upon the process variables, the temperature, and the supply voltage. Thus, the specific voltage at the gate of transistor 30 will, within the range of compensation, be that to ensure that the switching point of inverter 14 is at the predetermined value; for example 1.4 volts.

The condition shown in FIG. 4 causes the voltage on output line 25 to drop to about 0.5 volts for a logic ZERO for a logic ONE input. It is to be noted that the transition from a ONE to a ZERO on line 25 with a minimum delay in switching depends upon transistor 24 sourcing current $I_P$ and the flow of currents $I_{N1}$ and $I_{N2}$ to ground. Generally, $I_{N2}$ is greater than $I_{N1}$ and $I_P$ is much smaller than the total $I_N$ current. It must be noted that any parasitic capacitance between bias line 20 at the gate of transistor 30 and output line 25 will couple the output to the gate and cause a depression of the bias voltage. If enough coupling is present, the impedance of transistor 30 can increase, reducing the control by transistor 28 of the output voltage and increasing the switching delay. To reduce this problem, transistor 26 provides a parallel path to ground controlled by the TTL input signal and not by the bias voltage on line 20. Thus, compensation for noise coupled onto the bias line 20 is provided.

Further, it is desirable to "stiffen" the bias line 20. There will be some minimum value of interconnect capacitance present dependent upon the number of inverters attached to the line. In addition, it may be desirable to add a capacitance 21 shown in FIG. 2 physically close to bias generator 12. It has been found that capacitance 21 having a value C of $$C = 10 \, (nC_m)$$

where n is the number of CMOS inputs simultaneously switched by TTL outputs, and $C_m$ is the gate-to-drain capacitance of transistor 30, will dissipate the Miller effect noise induced in bias line 20 permitting minimum switching delay on output line 25.

When the ZERO logic level of 0.8 volts is applied to input line 23 as shown in FIG. 5, the impedances of transistors 26, 28, and 30 become extremely high. This causes the supply voltage of typically 5 volts to occur on output lead 25.

To establish the ratios of currents in the transistors of inverter/buffer 14, the lengths and idths of the N and P materials are controlled during fabrication. For example, the following device sizes are suitable:

| Transistor | (Microns) | Variations | Microns | Variations |
| --- | --- | --- | --- | --- |
| 24 | 3 | −1.6 to −0.7 | 50 | −1.5 to −0.7 |
| 26 | 3 | −1.0 to −0.4 | 10 | −1.0 to −0.2 |
| 28 | 3 | −1.0 to −0.4 | 180 | −1.0 to −0.2 |
| 30 | 3 | −1.0 to −0.4 | 60 | −1.0 to −0.2 |

As may be noted, the width of transistor 28 produces a re latively large drain junction capacitance. However, when the input level on lead 23 from the TTL output changes to 0.8 volts, the resistance through transistor 30 rises to a maximum, which may be on the order of $10^{14}$ ohms. Thus, output lead 25 is effectively isolated from the large drain junction capacitance of transistor 28, permitting a fast rise time to the 5 volt level.

When the temperature of chip 10 changes, P and N device parameters change as well, affecting the switching point for the inverter. However, the change in the device parameters in the bias generator changes the bias voltage in a direction to cause the device transconductances in the inverter to vary in a direction to oppose the temperature effects.

As will now be recognized, an integrated circuit for interfacing TTL logic to CMOS logic has been disclosed which is compensated for process variations, temperature, and supply voltage. Although a specific circuit has been shown for exemplary purposes, various modifications thereto may be made without departing from the spirit and scope of the invention.

I claim:

1. An interface circuit on an integrated circuit chip, said chip having a CMOS logic circuit to be driven from an external TTL logic circuit, said chip having a pair of terminals connected to a supply voltage, said interface circuit comprising:

CMOS intverter means having an input for receiving logic level signals from said TTL logic circuit and an output operatively connected to an input of said CMOS logic circuit, said inverter means having an input switching voltage level at which a binary logic level signal at said output changes level, said switching voltage dependent upon the value of said supply voltage, the temperature of said chip, and with the fabrication process of said chip, and in which said switching voltage level is controllable by a bias voltage; and bias voltage generation means on said chip having an output bias voltage connected to said inverter means, said bias voltage generation means connected between said pair of supply voltage terminals, said bias generation means having active voltage divider means connected to said inverter means for supplying a bias voltage less than a voltage across said supply voltage terminals in which said bias voltage varies with said supply voltage, with the temperature of said chip, and with variations in the process of fabrication of said logic chip whereby said switching voltage level of said inverter means is stabilized.

2. A device for conditioning TTL logic signals for operation of CMOS logic circuitry disposed on a semiconductor chip comprising:

(a) an input on said chip for receiving said TTL signals;

(b) a CMOS inverter/buffer on said chip connected between a pair of supply voltage terminals and having a signal input connected to receive said TTL signals, an output connected to said CMOS logic circuitry on said chip, and means connected to said CMOS inverter/buffer, said means having a bias voltage input, said inverter/buffer having a preselected voltage level at which the logic level at said output switches; and (c) a CMOS bias generator on said chip connected between said pair of supply voltage terminals, said bias generator having active voltage divider means connected to said inverter/buffer bias voltage input for producing a bias voltage less than a voltage across said voltage terminals in which said bias voltage is applied to said bias voltage input and varies with said supply voltage, with the temperature of said chip, and with variations in the process of fabrication of said logic chip whereby said switching voltage level of said inverter/buffer is stabilized, said bias generator including:

(i) a first N-channel transistor and a first P-channel transistor connected as as first voltage divider across said supply voltage terminals to produce a precompensation bias voltage at an output thereof, (ii) a second P-channel transistor having its gate connected to said first voltage divider output, said second P-channel transistor connected to a pair of N-channel tranisistors, said second P-channel transistors serving as a second voltage divider across across said supply voltage terminals to produce said bias voltage at said bias voltage input, and (iii) a bias voltage line on said chip for supplying said bias voltage to a plurality of CMOS logic circuits disposed on said chip.

3. The device as recited in claim 2 which further comprises a capacitor connected between said bias voltage line and a ground connection of said chip.

4. In an intergrated circuit logic chip connected to a pair of supply voltage terminals and having a CMOS logic circuit theron which is to be driven from a TTL logic circuit, an interface circuit for conditioning logic level signals from said TTL circuits to switch said CMOS logic circuit at a preselected switching voltage and in which said interface circuit is compensated for voltage, process and temperature variation, comprising:
(a) a bias generator for producing a compensated bias voltage including
  (i) a first N-channel transistor and a first P-channel transistor connected as a first voltage divider across said supply voltage terminals to produce a precompensation bias voltage at an output thereof,
  (ii) a second P-channel transistor having its gate connected to said first voltage divider output, said second P-channel transistor connected to a pair of N-channel transistors, said second P-channel transistor and said pair of N-channel transistors serving as a second voltage divider across said supply voltage terminals to produce said bias voltage at a bias voltage output;
(b) an input on said chip externally connected to receive said TTL signals;
(c) a CMOS inverter including
  (i) a P-channel transistor having a source connected to a positive terminal of said pair of supply voltage terminals, a drain connected to an inverter input,
  (ii) a first N-channel transistor having a drain connected to said output, a source connected to a negative terminal of said pair of supply voltage terminals, and a gate connected to said input,
  (iii) a second N-channel transistor having a drain connected to said output, and a gate connected to said bias voltage output, and
  (iv) a third N-chnnel transistor having a drain connected to a source of said second N-channel tranisistor, a source connected to said negative terminal, and a gate connected to said signal input.

5. A device for conditioning TTL logic level signals for operation of CMOS logic circuitry disposed on a semiconductor chip comprising:
an input on said chip for receiving said TTL signals;
a CMOS inverter/buffer on said chip connected between a pair of supply voltage terminals and having a signal input connected to receive said TTL signals, an output connected to receive said TTL signals, an output connected to said CMOS logic circuitry on said chip, and means connected to said CMOS inverter/buffer, said means having a bias voltage input, said inverter/buffer having a preselected voltage level at which the logic level at said output switches; and
a CMOS bias generator on said chip connected between said pair of supply voltage terminals, said bias generator having active voltage divider means connected to said inverter/buffer bias voltage input for producing a bias voltage less than a voltage across said supply voltage terminals in which said bias voltage is applied to said bias voltage input and varies with said supply voltage, with the temperature of said chip, and with variations in the process of fabrication of said logic chip whereby said switching voltage level of said inverter/buffer is stabilized.

6. The device as recited in claim 1 in which said bias generator includes:
a first N-channel transistor and a first P-channel transistor connected as a first voltage divider across said supply voltage terminals to produce a precompensation bias voltage at an output thereof; and
a second P-channel transistor having its gate connected to said first voltage divider output, said second P-channel transistor connected to a pair of N-channel transistors, said second P-channel transistor and said pair of N-channel transistor serving as a second voltage divider across said supply voltage terminals to produce said bias voltage at said bias voltage input.

7. The device as recited in claim 6 in which said bias generator further includes a bias voltage line on said chip for supplying said bias voltage to a plurality of CMOS logic circuits disposed on said chip.

8. The device as recited in claim 7 which further comprises a capacitor connected between said bias voltage line and a ground connection of said chip.

9. The device as recited in claim 1 in which said inverter/buffer include:
a P-channel transistor having a source connected to a positive terminal of said pair of supply voltage terminals, a drain connected to said output, and a gate connected to said signal input;
a first N-channel transistor having a drain connected to said output, a source connected to a negative terminal of said pair of supply voltage terminals, and a gate connected to said signal input;
a second N-channel transistor having a drain connected to said output, and a gate connected to said bias voltage input; and
a third N-channel transistor having a drain connected to a source of said second N-channel transistor, a source connected to said negative terminal, and a gate connected to said signal input.

10. The device as recited in claim 2 in which said input includes an input protection circuit.

* * * * *